United States Patent
Gabara et al.

[19]

[11] Patent Number: 6,107,882
[45] Date of Patent: Aug. 22, 2000

[54] AMPLIFIER HAVING IMPROVED COMMON MODE VOLTAGE RANGE

[75] Inventors: Thaddeus John Gabara, Murray Hill, N.J.; Makeshwar Kothandaraman, Emmaus; Bijit Thakorbhai Patel, Breinigsville, both of Pa.

[73] Assignee: Lucent Technologies Inc., Murray Hill, N.J.

[21] Appl. No.: 09/065,255

[22] Filed: Apr. 23, 1998

Related U.S. Application Data

[63] Continuation-in-part of application No. 08/989,113, Dec. 11, 1997.

[51] Int. Cl.$^7$ .................................................. H03F 3/45
[52] U.S. Cl. ................................................ 330/253; 330/258
[58] Field of Search ..................................... 330/9, 253, 258

[56] References Cited

U.S. PATENT DOCUMENTS

| | | | |
|---|---|---|---|
| 4,520,324 | 5/1985 | Jett, Jr. et al. | 330/285 |
| 4,577,162 | 3/1986 | Peterson | 330/253 |
| 5,231,318 | 7/1993 | Reddy | 307/530 |
| 5,406,145 | 4/1995 | Arai et al. | 327/362 |

*Primary Examiner*—Robert Pascal
*Assistant Examiner*—Henry Choe
*Attorney, Agent, or Firm*—John M. Harman

[57] ABSTRACT

Embodiments of the invention include an amplifier such as a differential amplifier having an improved common mode voltage range (CMVR). The amplifier includes a translator coupled to a second stage amplifying circuitry wherein the translator uses feedback and a parallel connection of input devices to improve the common mode voltage range of the amplifier while providing for enablement of the circuit functionality. The translator uses parallel connections of N-channel and P-channel devices such as transistors to extract alternating current (ac) signals riding on a common mode voltage and to translate the extracted ac signals to ride on a constant reference voltage ($V_{ref}$). The translated signals are then amplified in a conventional manner, such as by a gate thresholding or a self-biasing technique. An input sensing circuit within the translator provides an offset detection signal to a correction circuit, also within the translator. The correction circuit compares the signal with an applied reference signal ($V_{ref}$) and, based thereon, applies a correction signal to the input sensing circuit. With the benefit of such correction signals, the input sensing circuit translates an input signal with a large common mode voltage range to an output signal that rides on the dc voltage that is approximately equal to the reference signal, $V_{ref}$.

17 Claims, 7 Drawing Sheets

AMPLIFIER HAVING IMPROVED COMMON MODE VOLTAGE RANGE

CROSS REFERENCE TO RELATED APPLICATIONS

This application is a CIP of U.S. application Ser. No. 08/989,113 filed Dec. 11, 1997.

BACKGROUND OF THE INVENTION

1. Field of the Invention

The invention relates to amplifiers such as differential amplifiers. More particularly, the invention relates to amplifiers such as differential amplifiers having improved common mode voltage range (CMVR).

2. Description of the Related Art

Amplifiers such as differential amplifiers are useful for various circuit applications, including within signal receivers. Differential amplifiers typically are used to amplify both analog and digital signals, and to provide amplifier outputs in response to differential inputs. Furthermore, differential amplifiers are readily adaptable to function as an operational amplifier, a comparator, a sense amplifier and as a front-end buffer stage for another circuit.

However, conventional differential amplifiers will operate only over a relatively narrow range of common-mode input voltages. As the amplifier is forced to extend beyond this small range of common-mode voltages, the differential-mode gain drops off sharply and sometimes drops to zero. Another difficulty in conventional differential amplifiers is the possibility of a portion of the common mode voltage range (CMVR) disabling the functionality of the circuit. For example, if the input signals with a common mode voltage of 0 to $V_{th}$ are applied to N-channel transistors, the circuit can become disabled.

One method of extending the common mode range of differential amplifiers is disclosed in U.S. Pat. No. 4,958,133, issued Sep. 18, 1990 to Bazes and entitled "CMOS Complementary Self-Biased Differential Amplifier With Rail-To-Rail Common-Mode Input-Voltage Range". The Bazes differential amplifier combines two complementary folded-cascade differential amplifiers and connects all of the bias inputs to a single internal node to yield a differential amplifier that successfully extends the common voltage range without disabling the circuit. However, the Bazes' extension of the common-mode voltage range consumes additional power, requires a relatively complex circuit design and hinders performance.

It is desirable to have a differential amplifier for amplifying differential input voltages in which the common-mode component can vary over an extremely wide range of voltages without otherwise causing amplifier operating difficulties.

SUMMARY OF THE INVENTION

The invention is embodied in an amplifier such as a differential amplifier having an improved common mode voltage range (CMVR). Embodiments of the invention include a translator coupled to a second stage amplifying circuitry wherein the translator uses feedback and a parallel connection of input devices to improve the common mode voltage range of the amplifier while providing for enablement of the circuit functionality. The translator uses parallel connections of N-channel and P-channel devices (e.g., transistors) to extract alternating current (ac) signals riding on a common mode voltage and to translate the extracted ac signals to ride on a constant reference voltage ($V_{ref}$). The translated signals are then amplified, e.g., by an advantageous self-biasing technique or a conventional gate thresholding technique. An input sensing circuit within the translator provides an offset detection signal to a correction circuit, also within the translator. The correction circuit compares the signal with an applied reference signal ($V_{ref}$) and, based thereon, applies a correction signal to the input sensing circuit. With the benefit of such correction signals, the input sensing circuit translates an input signal with a large common mode voltage range to an output signal that rides on the dc voltage that is approximately equal to the reference signal, $V_{ref}$. Amplifiers according to embodiments of the invention have shown the extraction of a 1.4 gigabits/second (Gb/s), 100 millivolt (mV) signal with a CMVR of 0 to 2.4 volts into full CMOS levels with a power dissipation of less than 25 milliwatts (mW). Also, the circuitry of such amplifiers is less complex than conventional amplifiers.

DETAILED DESCRIPTION

Figure 1:
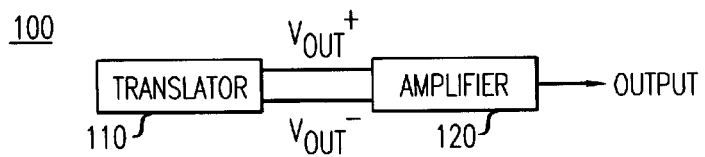
FIG. 1 is a simplified schematic diagram of a differential amplifier according to embodiments of the invention.

In the following description similar components are referred to by the same reference numeral in order to simplify the sequential aspect of the drawings and to enhance the understanding of the invention through the description of the drawings.

Although specific features, configurations and arrangements are discussed hereinbelow, it should be understood that such is done for illustrative purposes only. A person skilled in the relevant art will recognize that other steps, configurations and arrangements can be used without departing from the spirit and scope of the invention.

Embodiments of the invention are based on the advantageous realization that, within an amplifier such as a differential amplifier, paralleling an opposite polarity device across the input portion of the amplifier improves the extraction of alternating current (ac) signals over a larger common mode voltage range (CMVR) within the amplifier. As will become apparent from discussions hereinbelow, the common mode voltage range typically is the average voltage of the input voltages $V_{in}^+$ and $V_{in}^-$ (sometimes referred to as $V_{in}$ and $\underline{V}_{in}$), where $V_{in}^-$ is the inverse of $V_{in}^{30}$.

The performance of amplifiers such as differential amplifiers can be viewed as a two step process. First, the small ac signals riding on a wide common mode range of direct current (dc) signals are translated to a signal (with little or no gain) riding on a second dc voltage level that has a range significantly less than the pre-translated signal. For example, the second dc voltage level remains approximately constant for an ac signal that has a peak-to-peak magnitude of approximately 100 millivolts (mV) with a CMVR of $V_{dd}$-$V_{ss}$. The translator typically provides a gain of less than approximately 1 to as much as approximately 3.

The second step is to amplify the 100 mV to 300 mV translated signal to full CMOS swings (i.e., from the upper source voltage, $V_{dd}$, to the lower source voltage, $V_{ss}$). Because the translated ac signal now rides on a constant dc voltage that is independent of the common-mode voltage range of the input signal, it is possible to use conventional techniques to amplify the signal from a range of approximately 100 mV to 300 mV to full CMOS voltage swings. As will be discussed in greater detail hereinbelow, the amplification step is performed, e.g., using either an advantageous self-biasing technique or a conventional gate thresholding technique.

As shown generally in FIG. 1, a differential amplifier 100 according to embodiments of the invention includes a translator 110 coupled to an amplifier 120, if the signal needs to be amplified. Typically, the need of the amplifier depends on the amplitude of the input voltage swing. Translator 110, which is equipped with feedback and the aforementioned advantageous paralleling technique, translates the extracted signal over a wide common mode voltage range and level shifts it to a second, nearly constant dc voltage. Amplifier 120 amplifies the translated signal into full logic levels.

As mentioned previously herein, one of the difficulties of the translation circuit is preventing a portion of the input common mode voltage range from disabling the functionality of the circuit. For example, if the input signals with a common mode voltage of 0 to $V_{th}$ are applied to N-channel transistors, the circuit may become disabled. The circuit disclosed in Bazes (U.S. Pat. No. 4,958,133) overcomes this difficulty but sacrifices performance in terms of power dissipation and circuit complexity.

Figure 2A:
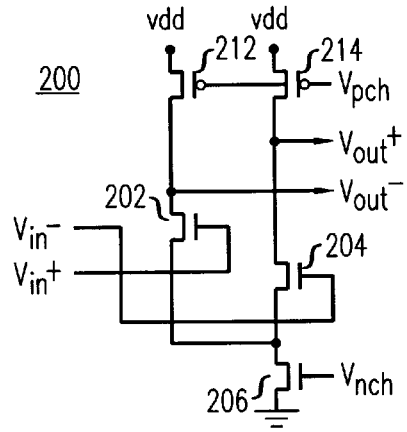
FIG. 2a is a circuit diagram of a conventional differential amplifier.
Figure 2B:
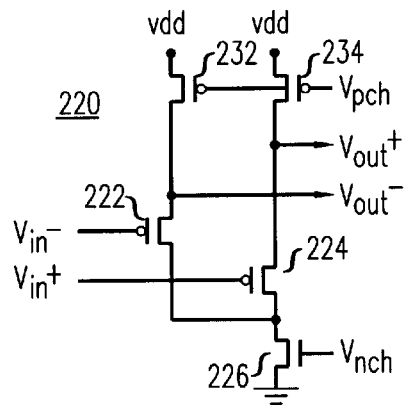
FIG. 2b is a circuit diagram of a conventional voltage follower buffer stage.
Figure 2C:
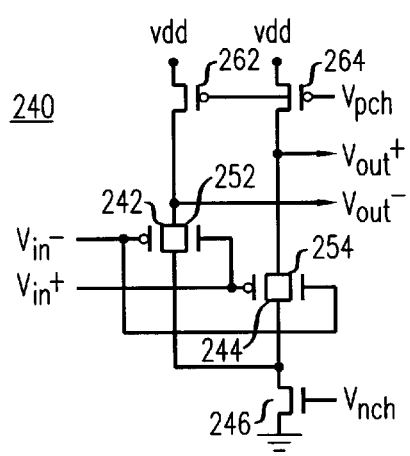
FIG. 2c is a circuit diagram of a composite amplifier according to an embodiment of the invention.

Referring now to FIGS. 2a-c, according to embodiments of the invention, the translation of the ac signals is performed using a hybrid circuit arrangement that combines a conventional differential amplifier circuit arrangement 200 shown in FIG. 2a with a conventional voltage follower buffer stage arrangement 220 shown in FIG. 2b. The resulting composite amplifier circuit 240 is shown in FIG. 2c. The voltages $V_{pch}$ and $V_{nch}$ are provided, e.g., by a reference circuit, current mirror circuitry, self-biasing circuitry, or a combination thereof.

Arrangement 200 in FIG. 2a is a conventional differential amplifier that includes N-channel devices 202, 204, 206 and P-channel devices 212, 214. When the input applied to N-channel device 202 increases, the output signal $V_{out}^{31}$ is inverted and decreases. Arrangement 220 FIG. 2b includes a single N-channel device 226 and P-channel devices 222, 224 and 232, 234. Because the P-channel devices are configured as voltage followers, the gain of this circuit is less than approximately 1.

Since such configurations are non-inverting, the input signals $V_{in}^+$ and $V_{in}^-$ are applied to opposite legs in arrangement 220 as compared to arrangement 200 to insure output signal compatibility. When $V_{in}^-$ applied to P-channel device 222 decreases, the output signal $V_{out}^-$ decreases since the P-channel leg is non-inverting. Thus, given equivalent input signals, arrangement 200 and arrangement 220 perform equivalent operations to $V_{out}^-$. However, the common-mode voltage ranges of arrangement 200 and arrangement 220 overlap each other partially.

For example, when the common-mode voltage range is near the lower source voltage ($V_{ss}$), arrangement 220 is operational but arrangement 200 is not operational. Similarly, when the common-mode voltage range is near the upper source voltage ($V_{dd}$), arrangement 200 is operational and arrangement 220 is not. Accordingly, it would be advantageous to combine the positive attributes of both arrangements to create a wide common-mode voltage range arrangement.

According to embodiments of the invention, the single device in each leg of the amplifier is replaced in the composite circuit arrangement of FIG. 2c with parallel-connected N- and P-channel devices. More specifically, N-channel devices 202, 204 in FIG. 2a and P-channel devices 222, 224 in FIG. 2b are replaced with a first set of parallel-connected N- and P-channel devices 242, 252 in the first leg of the amplifier and a second set of parallel-connected N- and P-channel devices 244, 254 in the second leg of the amplifier.

The devices are connected in parallel in that their respective sources and drain are connected together. For example, the source of P-channel device 242 is connected to the drain of N-channel device 252 and the drain of P-channel device 242 is connected to the source of N-channel device 252. Similarly, the source and drain of P-channel device 244 are connected to the drain and source, respectively, of N-channel device 254.

As shown, each parallel-connected N- and P-channel device is driven by the opposite polarity signal ($V_{in}^+$, $V_{in}^-$). That is, the $V_{in}^-$ input signal is connected to P-channel device 242 in the first leg of the amplifier and to N-channel device 254 in the second leg of the amplifier. Similarly, the $V_{in}^+$ input signal is connected to N-channel device 252 in the first leg of the amplifier and P-channel device 244 in the second leg of the amplifier. For example, when $V_{in}^+$ increases (and $V_{in}^-$ decreases) devices 242 and 252 are further enabled, causing $V_{out}^-$ to decrease (which result is similar to what would happen if the same input signals were applied to arrangement 200 and arrangement 220 and their outputs were superimposed).

Conventional devices such as transmission gates use parallel connections of N-channel devices and P-channel devices while conventional devices such as pass gates use single N-channel or P-channel devices. Such devices typically are used in digital circuits as a switch, i.e., the gates of the devices are either fully enabled or fully disabled (a fully disabled device has infinite impedance). However, the composite arrangement according to embodiments of the invention and shown in FIG. 2c connects N-channel devices and P-channel devices in parallel in a circuit arrangement whereby, during operation of the circuit, at least one of the devices always is enabled, thus preventing an infinite impedance from occurring in the circuit.

Figure 3A:
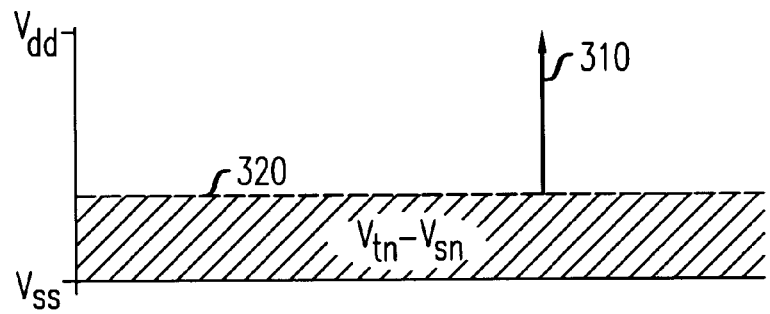
FIGS. 3a–b are graphical illustrations of the common-mode voltage range (CMVR) of the composite arrangement of FIG. 2c.
Figure 3B:
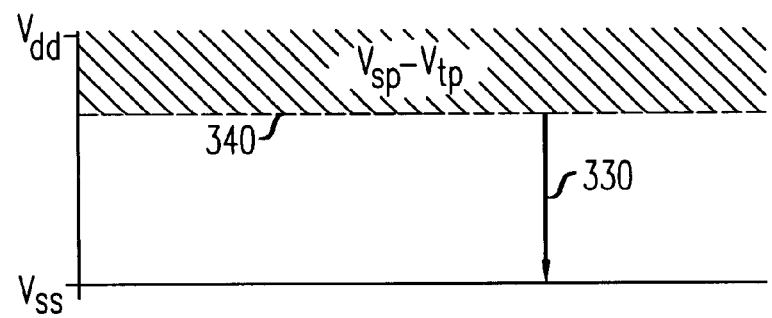

FIGS. 3a-b illustrate the common-mode voltage range (CMVR) of the N-channel and P-channel devices comprising the composite arrangement of FIG. 2c and resulting CMVR of the composite arrangement. In FIG. 3a, an arrow 310 indicates the CMVR needed to enable a N-channel device in the arrangement. A lower, dotted range 320 indicates where the threshold voltage of the N-channel device has not been achieved and, disregarding sub-threshold conditions, the operating region where the N-channel device is disabled.

In FIG. 3b, an arrow 330 indicates the CMVR of the gate voltage that must be applied to a P-channel device in the arrangement to enable the device. An upper dotted range 340 identifies the voltage region where the threshold voltage of the P-channel device has not been met and thus the device is not enabled.

Figure 4:
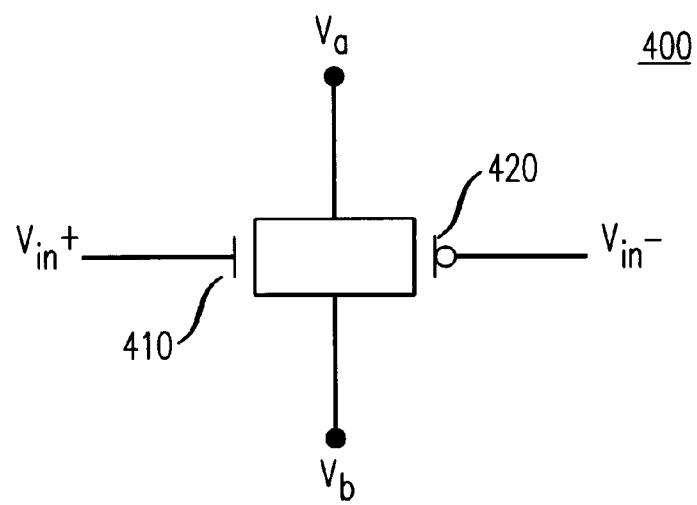
FIG. 4 is a circuit diagram of a composite device according to an embodiment of the invention.

FIG. 4 depicts a composite, enabling device 400 according to embodiments of the invention. More specifically, an N-channel device 410 and a P-channel device 420 are connected in parallel as shown. If the gate of one of the N-channel or P-channel devices is connected to $V_{in}^+$ and the gate of the other N-channel or P-channel device is connected to $V_{in}^-$, the resulting CMVR behaves as if the composite device performs as a logical OR operator. That is, one of the N-channel and P-channel devices is always in an "on" state. In such a manner, the resulting CMVR of composite, enabling device 400 therefore is effectively extended at least from $V_{ss}$ to $V_{dd}$. Accordingly, since an impedance path always exists between $V_a$ and $V_b$ (i.e., at least one component of the composite device is always in an "on" state), device 400 behaves as an adjustable resistor.

Figure 5A:
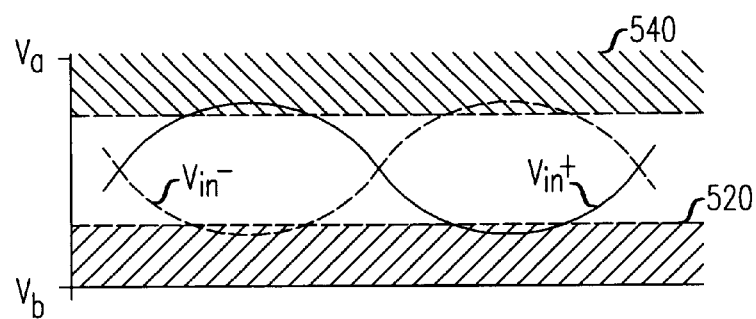
FIGS. 5a–d are graphical illustrations of various voltage signals applied to the device of FIG. 4.

FIGS. 5a–d illustrate various possible voltage swings that are applied to the composite, enabling device 400 shown previously in FIG. 4. FIG. 5a illustrates a large ac waveform $V_{in}^+$ and its inverse $V_{in}^-$, both of which extend into the "non-enabling" regions 520, 540. Regions 520, 540 correspond to the dotted regions 320, 340, respectively, in the previous FIGS. 3a–b. In FIG. 5a, when the value of ac waveform $V_{in}^+$ is in one of the non-enabling regions (and its inverse $V_{in}^-$ is in the other non-enabling region), the composite, enabling device has an infinite impedance (i.e., both the N-channel device and the P-channel device are disabled). In this manner, the composite device behaves as a conventional transmission gate since such an ac waveform is indicative of digital CMOS signals.

Figure 5B:
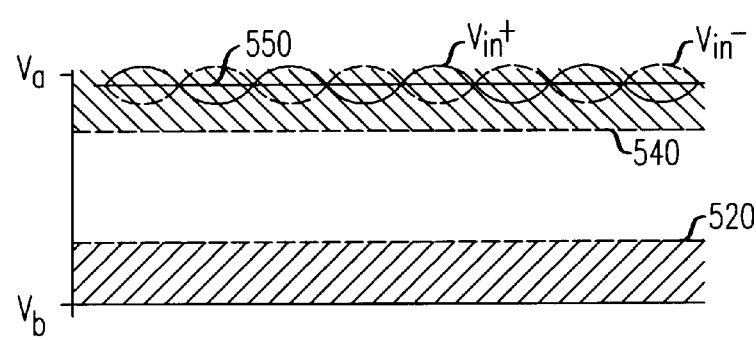
Figure 5C:
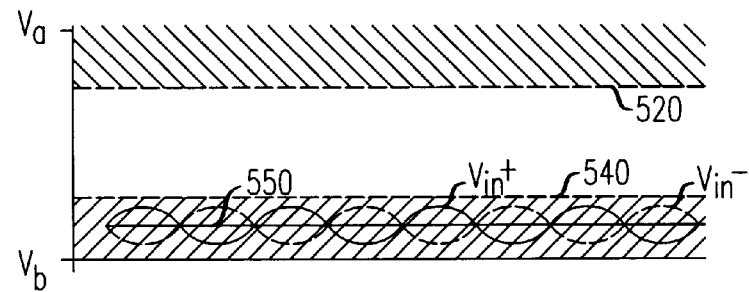
Figure 5D:
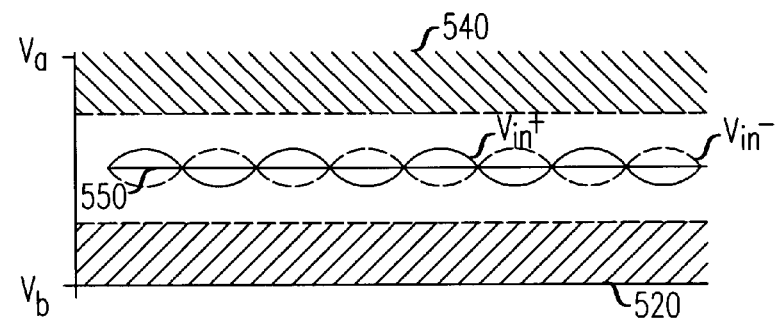

FIGS. 5b–d depict smaller ac waveforms and their inverses riding on a constant or approximately constant dc signal. In FIG. 5b, a small ac waveform $V_{in}^+$ and its inverse $V_{in}^-$ rides on a dc voltage (shown as 550) having a value within the upper, non-enabling region 540. With such waveforms applied to the composite, enabling device as shown in FIG. 4, the P-channel transistor will be disabled but the N-channel transistor will be enabled (by $V_{in}^+$).

Similarly, in FIG. 5c, a small ac waveform $V_{in}^+$ and its inverse $V_{in}^-$ rides on dc voltage 550 having a value within the lower, non-enabling region 520. With such waveforms applied to the composite, enabling device 400 as shown in FIG. 4, the N-channel transistor will be disabled but the P-channel transistor will be enabled.

In FIG. 5d, a small ac waveform $V_{in}^+$ and its inverse $V_{in}^-$ rides on dc voltage 550 having a value between the upper non-enabling region 540 and the lower non-enabling region 520. In this manner, with such waveforms applied to the composite, enabling device as shown in FIG. 4, both the N-channel and P-channel transistors will be enabled.

As shown, none of the ac waveforms or their inverses shown in FIGS. 5b–d occur simultaneously in both non-enabling regions (as was the case with the ac waveforms shown in FIG. 5a). Accordingly, assuming that the threshold voltages of the N-channel device and the P-channel device are equal ($V_{in}=|V_{tp}|$), and that ac waveform $V_{in}^+$ does not extend within both dotted, non-enabling regions 520, 540, at least one of either the N-channel or the P-channel transistors of the composite, enabling device shown in FIG. 4 will be enabled and thus the composite, enabling device itself will be enabled. In this manner, the composite device behaves as an adjustable resistor. When ac waveform $V_{in}^+$ reaches its maximum voltage, the composite device exhibits its minimum resistance.

Note that this combined effect of the differential signal $V_{in}^+$ and $V_{in}^-$ acts to either increase or decrease the effective resistance between $V_a$ and $V_b$. In other words, as $V_{in}^+$ is increasing, thereby enabling the N-channel device, $V_{in}^-$ is decreasing, further enabling the P-channel device. Such behavior perhaps is an appropriate building block for various circuit configurations such as sense amplifiers. Note that the operation of the composite, enabling device as shown in FIGS. 5b–d is significantly different than the behavior of the device when full swing waveforms are applied (as shown in FIG. 5a).

Figure 6A:
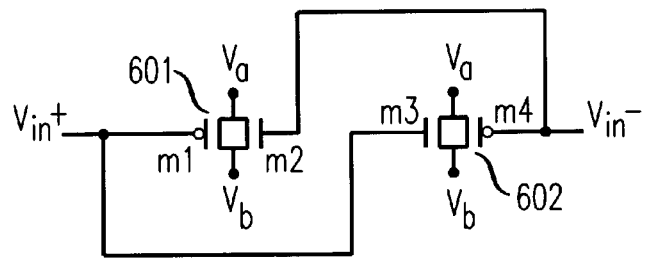
FIGS. 6a–b are circuit diagrams of a composite device according to alternate embodiments of the invention.
Figure 6B:
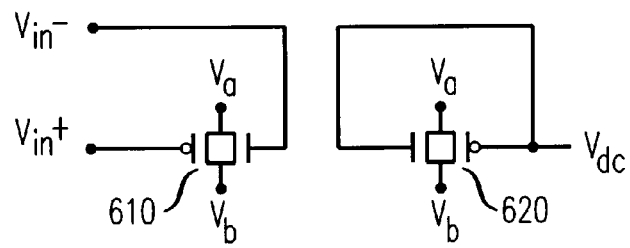

FIGS. 6a–b illustrate alternative embodiments of the invention, in which relatively small ac swing differentials are useful in controlling the behavior of a set of composite, enabling devices. It is assumed, for purposes of discussion, that the impedance elements are identical in the FIGURES. In FIG. 6a, the input signals are used to increase the effective impedance of one device while decreasing the effective impedance of the other device. For example, as $V_{in}^+$ increases and $V_{in}^-$ decreases, P-channel device M1 and N-channel device M2 of a first enabling device 601 increase in resistance while N-channel device M3 and P-channel device M4 of a second enabling device 602 decrease in resistance. In an alternative embodiment, as shown in FIG. 6b, the input signals $V_{in}^+$ and $V_{in}^-$ are applied to only one composite, enabling device 610, while the other composite, enabling device 620 has only the common mode dc voltage of the input signal ($V_{dc}$) applied to both transistors.

Although the inventive arrangements are shown and discussed with respect to their use within differential amplifiers, such arrangements are suitable for use in other devices, including sense amplifiers and operational amplifiers (op-amps). Also, such arrangements are suitable for incorporation into common gate and source follower arrangements. In this manner, the inventive arrangements improve the input detection and headroom of the devices into which the arrangements are incorporated.

Figure 7:
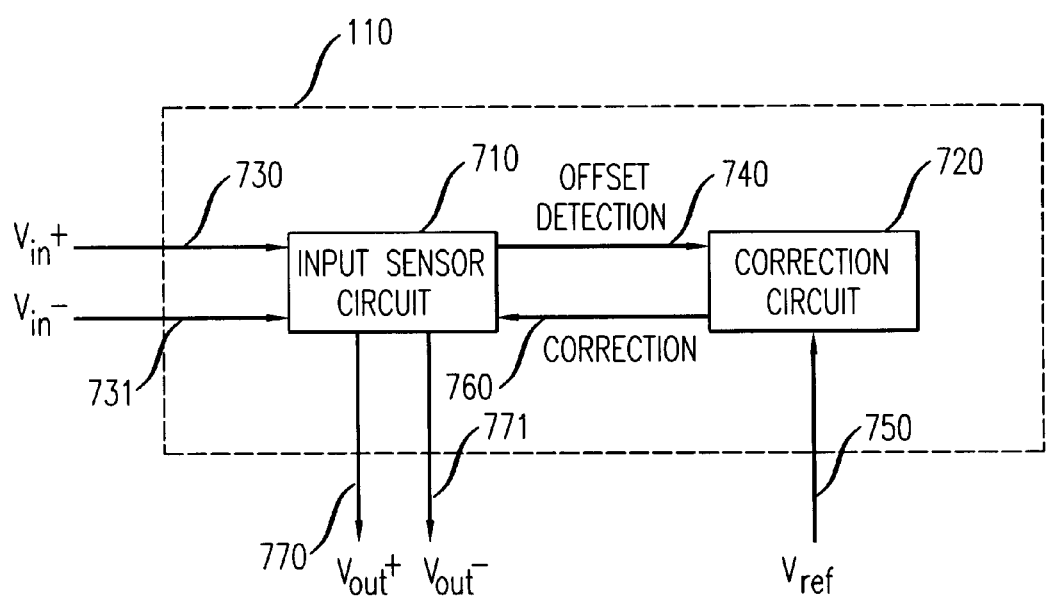
FIG. 7 is a simplified schematic diagram of a translator according to an embodiment of the invention.

Referring now to FIG. 7, a schematic of the operation of translator 110 is shown generally. As mentioned previously herein, translator 110 extracts small ac signals from various dc voltages levels within the common mode voltage range and causes the extracted ac signals to ride on a dc voltage level approximately equal to a reference voltage signal, $V_{ref}$. In one sense, translator 110 includes an Input Sensing Circuit 710 and a Correction Circuit 720, coupled together as shown.

In general, an automatic level shifting operation is required to provide for the small ac signal riding on the dc voltage. In operation, input signals $V_{in}^+$ (shown as 730) and $V_{in}^-$ (shown as 731) are applied to Input Sensing Circuit (ISC) 710. Input Sensing Circuit 710 generates an offset detection signal 740, which is applied to Correction Circuit (CC) 720. Correction Circuit 720 compares this signal with an applied reference voltage ($V_{ref}$) signal 750. Note that reference signal $V_{ref}$ 750 is approximately the same value as the dc voltage upon which the translated input signal will ride on. Correction Circuit 720 generates a correction signal 760, which is applied to Input Sensing Circuit 710. Input Sensing Circuit 710 translates input signals 730 and 731 with a large common mode range to output signals $V_{out}^+$ (shown as 770) and $V_{out}^-$ (shown as 771), which ride on an approximately constant dc voltage approximately equal to a reference signal $V_{ref}$ 750.

The translator according to the embodiment of the invention shown in FIG. 7 is self-correcting over PVT (Process, Voltage and Temperature) conditions and common mode input variations. Typically, $V_{ref}$ is varied by the user or, alternatively is derived from a reference circuit (i.e., an on-chip bandgap voltage) or applied externally.

Figure 8A:
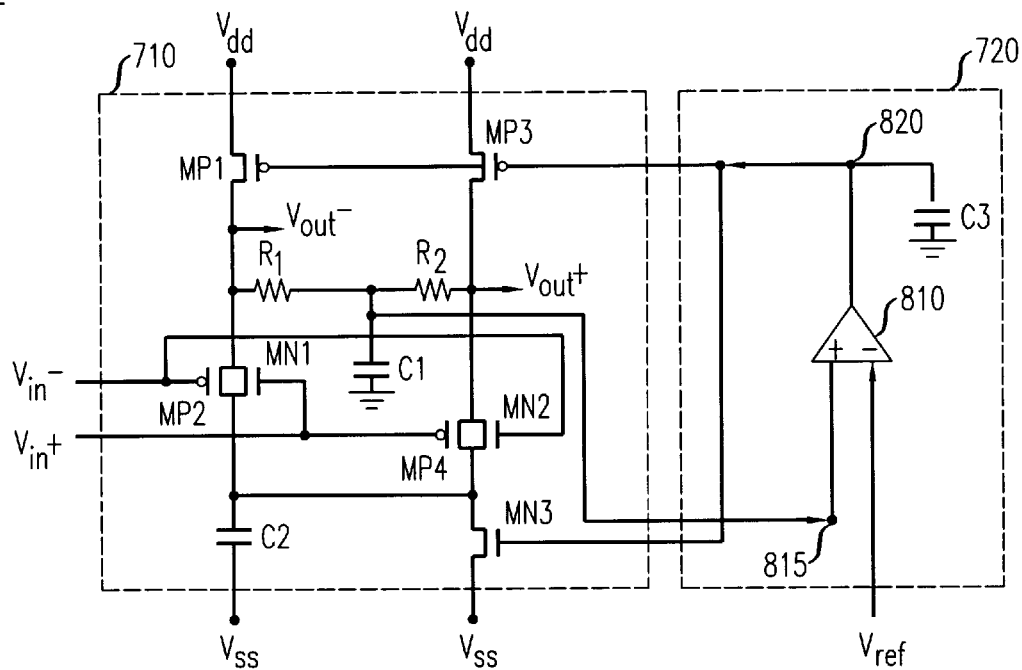
FIGS. 8a–b are circuit diagrams of translators according to embodiments of the invention.

Referring now to FIG. 8a, a circuit diagram of translator 110 according to an embodiment of the invention is shown. Translator 110 includes Input Sensing Circuit 710 and Correction Circuit 720. Input Sensing Circuit 710 includes N-channel devices MN1, MN2 and MN3; P-channel devices MP1, MP2, MP3 and MP4; an RC network (comprised of resistors R1, R2 and capacitor C1), and capacitor C2. Correction Circuit 720 includes an operational amplifier (op-amp) 810 and a capacitor C3. Although devices MP1 and MP3 are shown as P-channel devices, it should be noted that such devices can be N-channel devices or any other impedance element or group of elements, or any other resistive load, e.g., a current source.

The RC network, which functions herein as a low pass filter, generates the average dc voltage of the output signal and provides the offset detection signal at the non-inverting input (node 815) of op-amp 810. The offset detection signal is compared with a reference voltage $V_{ref}$ (at the inverting input of op-amp 810) to generate a correction signal at the output (node 820) of op-amp 810. The correction signal adjusts the operation of Input Sensing Circuit 710 and causes the average dc voltage generated by the RC network to match or approximately match the reference voltage $V_{ref}$.

For example, when the non-inverting input (node 815) of op-amp 810 becomes greater than $V_{ref}$, the output (node 820) of op-amp 810 increases, which decreases the conductance of P-channel devices MP1 and MP3 and increases the conductance of N-channel device MN3. Such action forces node 815 to decrease and approach $V_{ref}$. It should be noted that as the common mode voltage of the input signals ($V_{in}^+$ and $V_{in}^-$) is varied, the closed loop path within translator 110 adjusts the correction voltage accordingly.

As the dc voltage of the input signal (i.e., $V_{in}^+ - V_{in}^-$) decreases and falls within a non-enabling region (e.g., as shown in FIGS. 5b–c), devices MP2 and MP4 dominate. Op-amp 810, which controls devices MN3, MP1 and MP3, increases the drive of MN3 while the drive of MP1 and MP3 are decreased. Translator 110 translates the balanced input signal, $V_{in}^+$ and $V_{in}^-$, to a balanced output signal, $V_{out}^+$ and $V_{out}^-$, with a dc voltage established by the reference voltage $V_{ref}$. As known to those skilled in the art, a balanced signal one that is equal in magnitude and opposite in polarity with respect to ground or, in this case, with respect to a dc voltage $(V_{in}^+ - V_{in}^-)/2$. The gain of translator 110 in this circuit varies from less than 1 to approximately 3.

The output of translator 110 (i.e., $V_{out}^+$ and $V_{out}^-$) which is in the form an ac signal riding on the dc voltage having a value approximately equal to the reference voltage $V_{ref}$, is coupled to amplifier 120 (see FIG. 1). Such amplification is performed, e.g., in a conventional manner. In one embodiment of the invention, amplifier 120 uses a gate threshold matching technique, e.g., the technique disclosed in U.S. Pat. No. 5,268,872 issued Dec. 7, 1993 to Fujii et al.

Figure 8B:
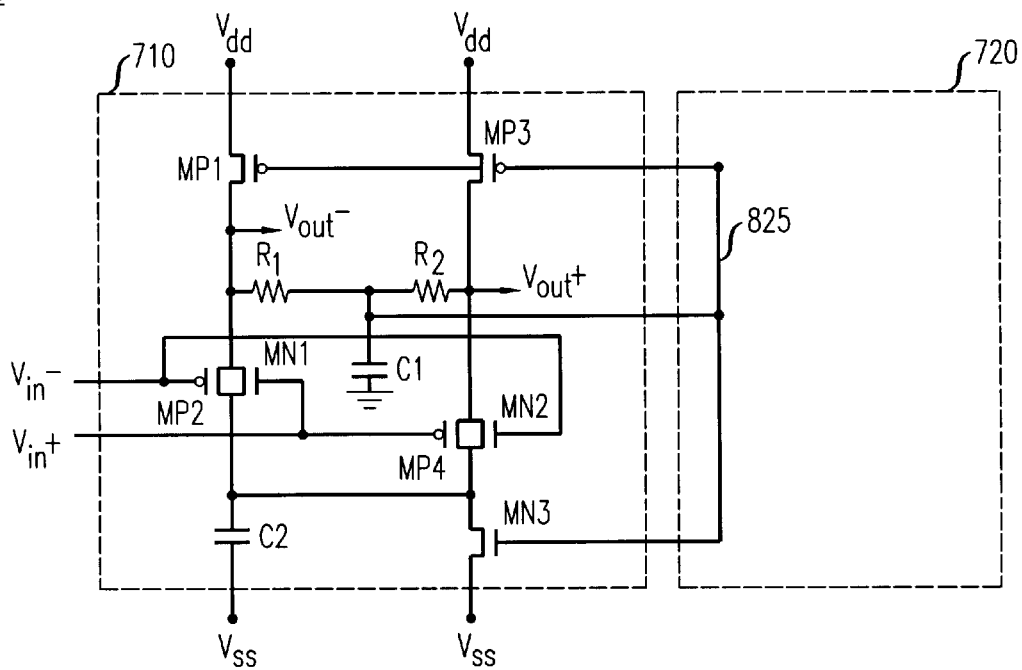

Alternatively, as shown in FIG. 8b, translator 110 includes an advantageous self-biasing arrangement according to an embodiment of the invention. More specifically, Correction Circuit 720 comprises a self-biased feedback circuit (shown generally as 825) rather than the op-amp feedback arrangement of FIG. 8a.

In operation, self-biased feedback circuit 825 senses the output common-mode voltage, $V_{ocm}$, via the RC sampling circuit network comprised of R1, R2 and C1. The output common-mode voltage is fed back to regulate the load devices MP1, MP3 and the bias current source MN3. For example, when the output common-mode voltage increases due to a change in the input common-mode voltage, the bias current and the load resistance increase. The increase in bias current and load resistance causes the output common-mode voltage to decrease. Thus, self-biased feedback circuit 825 regulates the bias current source MN3 and the load devices MP1 and MP3 to maintain a nearly constant output common-mode voltage.

The differential output signals, $V_{out}^-$ and $V_{out}^+$, tend to vary around a constant common-mode voltage. Accordingly, $V_{out}^-$ and $V_{out}^+$ are amplified easily and converted to a single-ended signal. The self-biased feedback circuit 825 shown in FIG. 8b is advantageous in that it simplifies the circuit design, reduces component area on the chip, and consumes less power.

Figure 9:
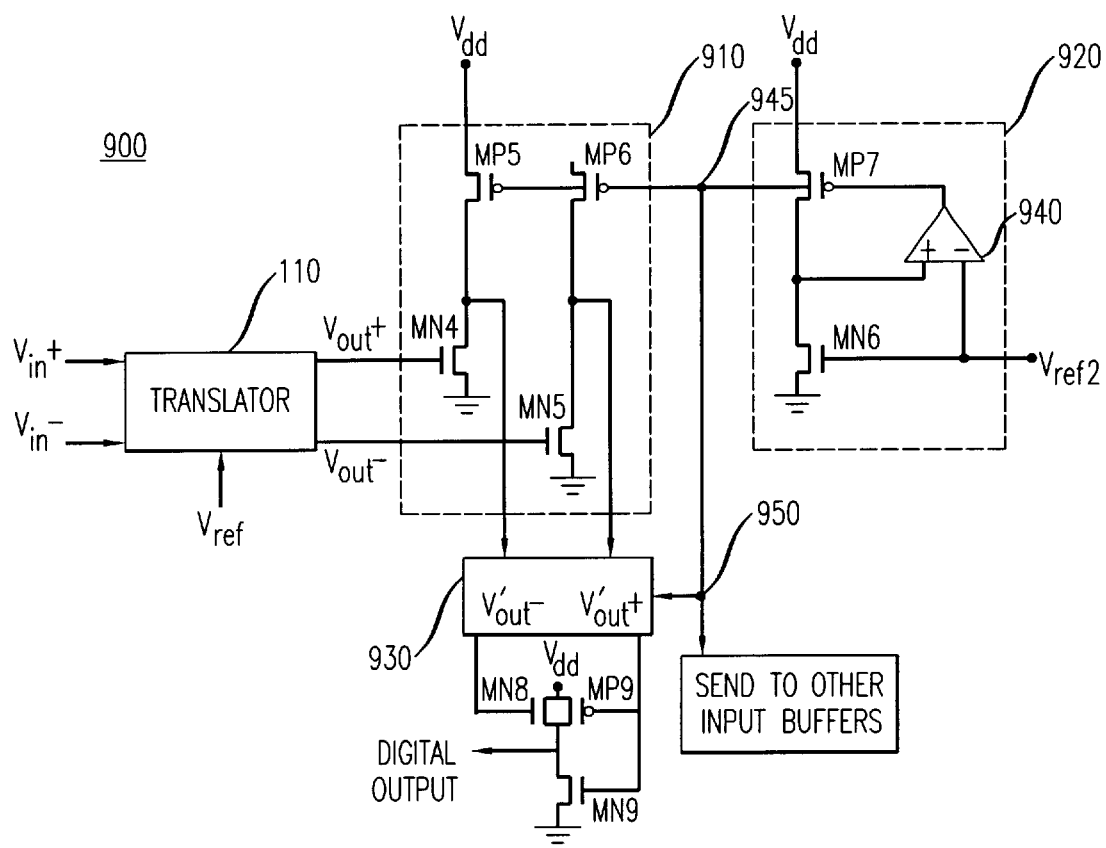
FIG. 9 is a circuit diagram of an amplifier arrangement using the translator shown in FIG. 8.

Referring now to FIG. 9, an amplification circuit 900 suitable for use with stage (shown generally in FIG. 9 as 910), a reference circuit (shown as 920) and translator 110 is shown generally. Typically, such an amplifier circuit includes a second additional stages (shown generally as 930) such as third and fourth stages. Second stage 910 includes N-channel devices MN4 and MN5, and P-channel device MP5 and MP6. Reference circuit 920 includes P-channel device MP7, N-channel device MN6, and an op-amp 940 connected as shown. According to an embodiment of the invention, op-amp 940 uses a gate threshold matching technique, e.g., similar to the technique disclosed in U.S. Pat. No. 5,268,872.

The output ($V_{out}^+$ and $V_{out}^-$) from translator 110 is coupled to N-channel gates MN4 and MN5 of second stage 910. Typically, second stage 910 is a balanced pseudo-NMOS (N-channel Metal-Oxide Semiconductor) stage in which the P-channel loads, MP5 and MP6, are controlled by a gate threshold voltage $V_{pch}$ (at a node 945), which is generated by reference circuit 920. The signal at node 945 is generated only once and is sent to all other input buffers on the chip (shown generally as node 950).

Reference circuit 920 configured in the manner shown herein causes the second stage 910 to have a gate threshold voltage ($V_{gate}$) approximately equal to a reference voltage $V_{ref2}$, which is coupled to the inverting input of op-amp 940. Typically, the value of the reference voltage $V_{ref2}$ is set to approximately $V_{dd}/2$, wherein second stage 910 and additional stages 930 within amplification circuit 900 have ample headroom to amplify the signal.

Additional amplifier stages 930 are coupled to second stage 910, e.g., in the manner shown. Typically, additional amplifier stages 930 comprise third and fourth amplifier stages, both similar in configuration to second stage 910. However, the number of stages depends on the frequency of operation and the amplitude of the input signal $V_{in}^+$ and $V_{in}^-$.

The (balanced) output of additional amplifier stages 930 (shown as $V'_{out}^+$ and $V'_{out}^-$) is coupled to the gates of N-channel devices MN8 and MN9 and a P-channel device MP9, which are connected together, e.g., as shown. In this particular arrangement of devices, the gate loading of device MN8 is equal to the gate loading of devices MN9 and MP9 combined.

Therefore, to a first order, the capacitive loading imposed on nodes $V'_{out}^+$ and $V'_{out}^-$ of stages 930 is equal. In this manner, the waveforms of $V'_{out}^+$ and $V'_{out}^-$ are 180 degrees out of phase and are used advantageously in the subsequent arrangement of devices MN8, MP9 and MN9. The input signals to this arrangement of devices are differential while the output is single ended. Thus, the particular circuit arrangement including devices MN8, MP9 and MP9 forms a differential to single ended converter.

Simulation results using amplification circuit 900 indicate that, at an operating rate of approximately 1.4 gigabits/second (Gb/s), a 100 mV differential signal with a common mode voltage range of approximately 2.4 volts was extracted using just approximately 25 milliwatts (mW) of power. Furthermore, in addition to providing improved performance and power dissipation, amplification circuits according to embodiments of the invention provide circuitry that is less complex than the prior art.

Figure 10:
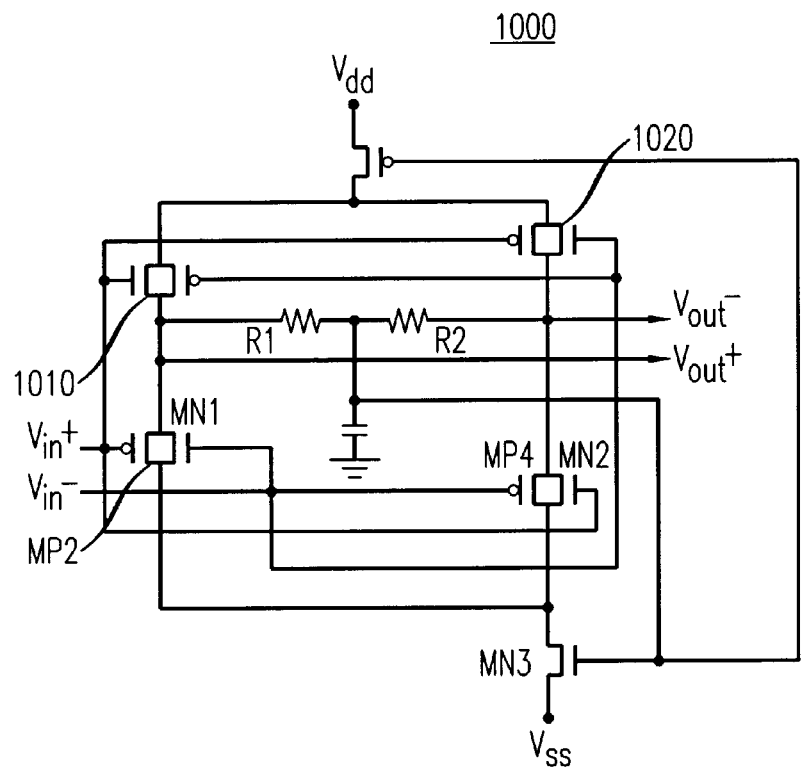
FIG. 10 is a circuit diagram of a translator according to an alternative embodiment of the invention.

Alternatively, as shown in FIG. 10, translator 110 as shown in FIG. 8 is modified to include additional parallel-connected N-channel and P-channel devices 1010 and 1020. Essentially, devices 1010 and 1020 mirror the parallel-connected devices formed by devices MP2 and MN1 and devices MP4 and MN2 are mirrored. In this manner, devices 1010 and 1020 complement the MP2/MN1 device and the MP4/MN2 device, respectively.

For example, when $V_{in}^+$ increases in amplitude, MP2 and the P-channel portion of device 1020 increase in resistance. Similarly, $V_{in}^-$ will decrease in amplitude, causing MN1 and the N-channel portion of device 1020 to increase in resistance. Thus, the MP2/MN1 device and device 1020, both functioning as adjustable resistors, increase in resistance. The remaining devices (i.e., the MP4/MN2 device and device 1010), also functioning as adjustable resistors, decreases in resistance. The result is that $V_{out}^+$ is pulled high and $V_{out}^-$ is pulled low. Therefore, the parallel-connected P-channel and N-channel devices act in a complimentary manner to detect the input signal.

Figure 11:
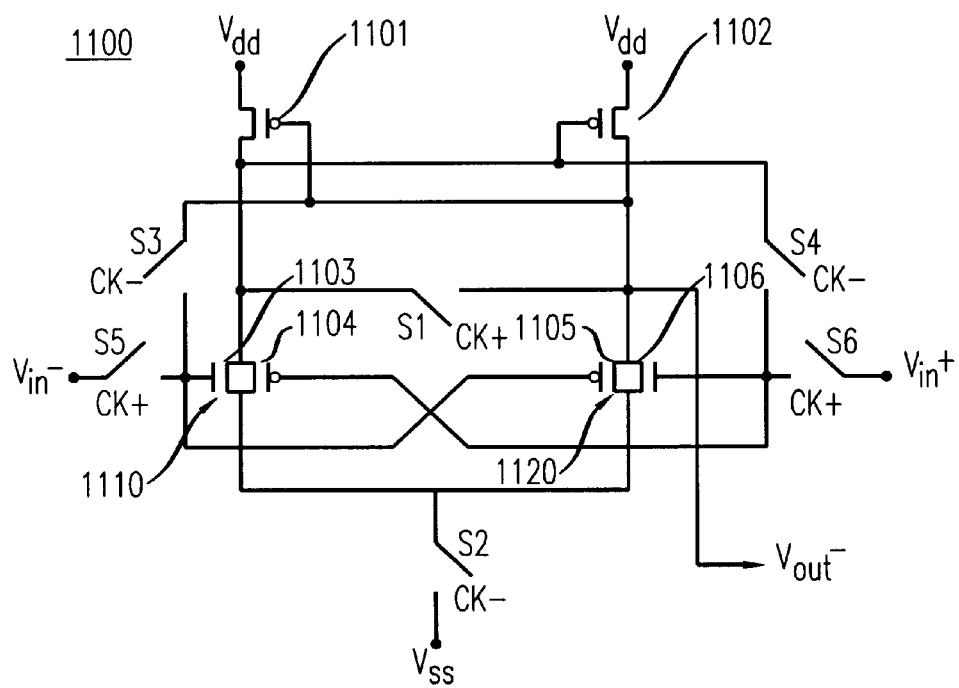
FIG. 11 is a circuit diagram of a sense amplifier including the amplifier arrangement according to an embodiment of the invention.

As discussed previously herein, circuit arrangements according to embodiments of the invention are suitable for use in sense amplifiers. For example, FIG. 11 illustrates a sense amplifier 1100 incorporating the inventive parallel-connected N-channel and P-channel devices, discussed previously herein, to improve the common mode voltage range thereof. Sense amplifier 1100 includes P-channel devices 1101, 1102, 1104, 1105, and N-channel devices 1103 and 1106 connected as shown. The parallel-connected N-channel and P-channel devices 1110 and 1120 are formed by devices 1103, 1104 and devices 1105, 1106, respectively. It should be noted that switches S1, S2, S3 and S4 are assumed to be ideal.

In operation, when clock signal CK$^+$ is enabled (i.e., a logical high), switches S5 and S6 are closed and input signals $V_{in}^+$ and $V_{in}^-$ are applied to devices 1110 and 1120. Also, the cross coupled RAM cell formed by P-channel devices 1101 and 1102 are shorted together by switch S1 closing. In this manner, the cell is initialized.

When clock signal CK$^-$ is enabled (clock signal CK$^+$ is disabled), switches S5 and S6 are open and the sampling of inputs signals $V_{in}^+$ and $V_{in}^-$ is terminated. Also, switches S2, S3 and S4 are closed and the information stored on the gates of devices 1103, 1104, 1105 and 1106 are amplified by the cross coupled arrangement of devices 1101 and 1102. Also, with switches S3 and S4 closed, positive feedback amplifies the signals at $V_{out}^+$.

It will be apparent to those skilled in the art that many changes and substitutions can be made to the embodiments of the amplifier herein described without departing from the spirit and scope of the invention as defined by the appended claims and their full scope of equivalents.

What is claimed is:

1. An amplifier having an improved common-mode voltage range, said amplifier having a first input, $V_{in}^+$, a second input, $V_{in}^-$, and at least one output $V_{out}$, said apparatus comprising:
    a translator for extracting an alternating current (ac) signal riding on a common mode direct current (dc) voltage and translating the extracted signal to ride on a reference direct current (dc) voltage ($V_{ref}$), wherein said translator includes at least one N-channel device and at least one P-channel device connected in parallel in such a way that, during operation of said amplifier, at least one of said N-channel device and said P-channel device is enabled,
    wherein said translator further comprises
        an input sensing circuit coupled to at least one of said first and second amplifier inputs, and
        a correction circuit coupled to said input sensing circuit,
        wherein said input sensing circuit provides an offset detection signal to said correction circuit and wherein said correction circuit provides a correction signal to said input sensing circuit.

2. The amplifier as recited in claim 1, further comprising a second stage circuit coupled to said translator for amplifying the extracted signal.

3. The amplifier as recited in claim 1, wherein the gate of said N-channel device is coupled to one of said first and second amplifier inputs and the gate of said P-channel device is coupled to the other of said first and second amplifier inputs.

4. The amplifier as recited in claim 1, wherein said input sensing circuit includes:
    an RC network that generates said offset detection signal based on the average DC voltage of said first and second outputs of said amplifier, wherein said at least one of said P-channel and N-channel devices is coupled to said RC network in such a way that said at least one of said P-channel and N-channel devices adjusts the voltage across said RC network based on the input signal to said amplifier.

5. The amplifier as recited in claim 1, wherein said correction circuit further comprises self-biasing feedback to said input sensing circuit.

6. The amplifier as recited in claim 1, wherein said correction circuit generates said correction signal in response to a comparison of a reference voltage ($V_{ref}$) coupled thereto and said offset detection signal received by said correction circuit.

7. The amplifier as recited in claim 2, wherein said amplifier includes an upper source voltage ($V_{dd}$) coupled thereto, and wherein said amplifier further comprises a reference circuit coupled to said second stage, said reference circuit establishing a threshold voltage for said second stage of approximately $V_{dd}/2$.

8. The amplifier as recited in claim 1, wherein said amplifier includes an upper source voltage ($V_{dd}$) coupled thereto, and wherein said extracted signal is amplified in such a way that said common mode voltage range is within the range from approximately 0 volts to approximately $V_{dd}$.

9. The amplifier as recited in claim 1, wherein said alternating current signal is less than approximately 400 millivolts (mV) peak-to-peak.

10. The amplifier as recited in claim 1, wherein said second stage amplifier circuit includes a gate thresholding technique.

11. An amplifier having an improved common-mode voltage range, said apparatus comprising:
    a first P-channel transistor having a gate, a source and a drain;
    a first N-channel transistor having a gate, a source and a drain coupled to said first P-channel transistor wherein the source of said first N-channel transistor is coupled to the drain of said first P-channel transistor and the drain of said first N-channel transistor is coupled to the source of said first P-channel transistor;
    a second P-channel transistor having a gate, a source and a drain;
    a second N-channel transistor having a gate, a source and a drain coupled to said second P-channel transistor wherein the source of said second N-channel transistor is coupled to the drain of said second P-channel transistor and the drain of said second N-channel transistor is coupled to the source of said second P-channel transistor;
    a third P-channel transistor having a gate, a source and a drain;

a third N-channel transistor having a gate, a source and a drain coupled to said third P-channel transistor wherein the source of said third N-channel transistor is coupled to the drain of said third P-channel transistor and the drain of said third N-channel transistor is coupled to the source of said third P-channel transistor;

a fourth P-channel transistor having a gate, a source and a drain; and a fourth N-channel transistor having a gate, a source and a drain coupled to said fourth P-channel transistor wherein the source of said fourth N-channel transistor is coupled to the drain of said fourth P-channel transistor and the drain of said fourth N-channel transistor is coupled to the source of said fourth P-channel transistor, wherein the source of said first P-channel transistor and the drain of said first N-channel transistor are coupled to a first supply voltage $V_{dd}$, wherein the drain of said first P-channel transistor and the source of said first N-channel transistor are coupled to a second supply voltage $V_{ss}$, wherein the gate of said first N-channel transistor is coupled to a first input signal $V_{in}^+$, wherein the gate of said first P-channel transistor is coupled to a second input signal $V_{in}^-$, wherein said second input signal $V_{in}^-$ is approximately equal in magnitude and approximately opposite in phase from said first input signal $V_{in}^-$, wherein the source of said second P-channel transistor and the drain of said second N-channel transistor are coupled to a first supply voltage $V_{dd}$ via an impedance element, wherein the drain of said second P-channel transistor and the source of said second N-channel transistor are coupled to a second supply voltage $V_{ss}$ via an impedance element, wherein the gate of said second P-channel transistor is coupled to said first input signal $V_{in}^+$, wherein the gate of said second N-channel transistor is coupled to said second input signal $V_{in}^-$, wherein said third P-channel transistor and said third N-channel transistor are coupled between said first supply voltage $V_{dd}$ and said first P-channel transistor and said first N-channel transistor, wherein the gate of said third N-channel transistor is coupled to said first input signal $V_{in}^+$, wherein the gate of said third P-channel transistor is coupled to said second input signal $V_{in}^-$, wherein said fourth P-channel transistor and said fourth N-channel transistor are coupled between said first supply voltage $V_{dd}$ and said second P-channel transistor and said second N-channel transistor, and wherein the gate of said fourth P-channel transistor is coupled to said first input signal $V_{in}^-$, and wherein the gate of said fourth N-channel transistor is coupled to said second input signal $V_{in}^-$.

12. The amplifier as recited in claim 11, wherein the drain of said first P-channel transistor, the source of said first N-channel transistor, the drain of said second P-channel transistor, and the source of said second N-channel transistor are coupled together.

13. The amplifier as recited in claim 12, further comprising a N-channel transistor coupled between said second supply voltage $V_{ss}$, and the drain of said second P-channel transistor and the source of said second N-channel transistor.

14. The amplifier as recited in claim 11, wherein said amplifier further comprises:

a fifth P-channel transistor coupled between said first supply voltage $V_{dd}$, the source of said first P-channel transistor, and the drain of said first N-channel transistor;

a sixth P-channel transistor coupled between said first supply voltage $V_{dd}$, the source of said second P-channel transistor, and the drain of said second N-channel transistor; and an RC network, wherein said RC network includes a first resistor having a first end coupled to the source of said first P-channel transistor and the drain of said first N-channel transistor, a second resistor having a first end coupled to the source of second P-channel transistor and the drain of said second N-channel transistor, and a capacitor coupled between the second ends of said first and second resistors.

15. The amplifier as recited in claim 14, further comprising a self-biasing feedback loop coupling said capacitor and the second ends of said first and second resistors, the gates of said P-channel transistors coupled between said first supply voltage $V_{dd}$, and the sources of said first and second P-channel transistors and the drains of said first and second N-channel transistors.

16. The amplifier as recited in claim 14, further comprising an operational amplifier, wherein said operational amplifier includes an inverting input coupled to a reference signal $V_{ref}$, a non-inverting input coupled between said capacitor and the second ends of said first and second resistors, and an output coupled to the gates of said P-channel transistors coupled between said first supply voltage $V_{dd}$ and the sources of said first and second P-channel transistors and the drains of said first and second N-channel transistors.

17. The amplifier as recited in claim 16, further comprising a second capacitor coupled to the output of said operational amplifier.

* * * * *